United States Patent
Minagawa

(10) Patent No.: US 10,020,297 B2
(45) Date of Patent: Jul. 10, 2018

(54) SEMICONDUCTOR MODULE

(71) Applicant: FUJI ELECTRIC CO., LTD., Kawasaki-shi, Kanagawa (JP)

(72) Inventor: Kei Minagawa, Matsumoto (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 38 days.

(21) Appl. No.: 15/255,127

(22) Filed: Sep. 1, 2016

(65) Prior Publication Data

US 2016/0372454 A1 Dec. 22, 2016

Related U.S. Application Data

(63) Continuation of application No. PCT/JP2015/075477, filed on Sep. 8, 2015.

(30) Foreign Application Priority Data

Sep. 9, 2014 (JP) ................. 2014-183090

(51) Int. Cl.
| | |
|---|---|
| *H02H 5/04* | (2006.01) |
| *H01L 27/02* | (2006.01) |
| *H02M 1/32* | (2007.01) |
| *H02M 7/539* | (2006.01) |
| *H02M 7/5387* | (2007.01) |

(52) U.S. Cl.
CPC .......... *H01L 27/0255* (2013.01); *H02M 1/32* (2013.01); *H02M 7/539* (2013.01); *H02M 7/5387* (2013.01); *H02M 2001/327* (2013.01)

(58) Field of Classification Search
CPC ....... H02M 3/5387; G01K 3/005; G01K 7/01; H02H 7/122
USPC ..... 363/56.01; 361/86–88, 91, 100–106, 97; 327/512, 513
See application file for complete search history.

(56) References Cited

U.S. PATENT DOCUMENTS

| | | | | |
|---|---|---|---|---|
| 5,325,258 A | * | 6/1994 | Choi | .................. H03K 17/0828 323/276 |
| 5,375,029 A | * | 12/1994 | Fukunaga | ............... G05F 1/573 323/285 |

(Continued)

FOREIGN PATENT DOCUMENTS

| | | |
|---|---|---|
| CN | 102299507 A | 12/2011 |
| EP | 1981160 A1 | 10/2008 |

(Continued)

*Primary Examiner* — Rajnikant Patel
(74) *Attorney, Agent, or Firm* — Rabin & Berdo, P.C.

(57) ABSTRACT

Control ICs for controlling IGBTs include overheat detection comparators that determine an overheated state of the case, in addition to overheat detection comparators that determine an overheated state of chips of the IGBTs. Outputs of the overheat detection comparators are input into an AND circuit, and when all of the overheat detection comparators determine the overheated state of the case, the AND circuit outputs a protection operation signal of high level, and an alarm output circuit outputs an alarm signal. The overheated state of the chips and the overheated state of the case are detected on the basis of chip temperatures measured by temperature detection diodes which are provided with the IGBTs respectively, and therefore a temperature detection IC for case overheat protection is unnecessary, and detection accuracy of the case overheat improves.

15 Claims, 13 Drawing Sheets

(56) References Cited

U.S. PATENT DOCUMENTS

| | | | | |
|---|---|---|---|---|
| 5,563,759 A * | 10/1996 | Nadd | ................ | H03K 17/0822 |
| | | | | 323/277 |
| 6,888,729 B2 * | 5/2005 | Maekawa | ................ | H02M 1/08 |
| | | | | 363/131 |
| 7,969,227 B2 * | 6/2011 | Hasegawa | ............... | G01K 3/005 |
| | | | | 327/512 |
| 8,284,575 B2 * | 10/2012 | Inamura | .................. | H02M 1/08 |
| | | | | 318/800 |
| 8,564,913 B2 * | 10/2013 | Motohashi | ............. | H02H 7/122 |
| | | | | 361/18 |
| 8,657,489 B2 | 2/2014 | Ladurner et al. | | |
| 8,797,700 B2 * | 8/2014 | Tanimura | ............... | G01K 3/005 |
| | | | | 361/103 |
| 9,225,233 B2 * | 12/2015 | Nakamori | ............... | H02M 1/32 |
| 2008/0251589 A1 | 10/2008 | Grbovic | | |
| 2011/0317315 A1 | 12/2011 | Motohashi et al. | | |
| 2012/0219033 A1 | 8/2012 | Tanimura et al. | | |
| 2014/0233602 A1 | 8/2014 | Kitazawa | | |

FOREIGN PATENT DOCUMENTS

| | | |
|---|---|---|
| EP | 2763168 A1 | 8/2014 |
| JP | 2002-184940 A | 6/2002 |
| JP | 2008-263774 A | 10/2008 |
| JP | 5295405 B1 | 9/2013 |
| WO | WO-2013/046309 A1 | 4/2013 |
| WO | WO-2014/129052 A1 | 8/2014 |

* cited by examiner

SEMICONDUCTOR MODULE

CROSS-REFERENCE TO RELATED APPLICATION

This application is a continuation application of International Application PCT/JP2015/075477 filed on Sep. 8, 2015 which designated the U.S., which claims priority to Japanese Patent Application No. 2014-183090, filed on Sep. 9, 2014, the entire contents of which are incorporated herein by reference.

BACKGROUND OF THE INVENTION

1. Field of the Invention

The embodiments discussed herein relate to a semiconductor module, and particularly to a semiconductor module that includes, in one package, a switching element, a diode, and a control integrated circuit (IC) for electric power conversion.

2. Background of the Related Art

In an electric power conversion inverter circuit or the like, insulated gate bipolar transistors (IGBTs) that are excellent in reducing loss and operating in a high frequency are used as switching elements. Such an IGBT has evolved from a single element to an intelligent power module (IPM) that contains a protection diode (a freewheeling diode) and a control IC including peripheral circuits such as a drive circuit and various types of protection circuits.

FIG. 11 illustrates an exemplary inner configuration of a past IPM.

An IPM 100 illustrated in FIG. 11 forms an inverter that outputs three-phase alternate-current voltage. Thus, the IPM 100 has a positive power supply terminal P, a negative power supply terminal N, and output terminals U, V, and W, and contains six IGBTs 101 to 106. Protection diodes 111 to 116 are provided on the same circuit pattern and are connected to the IGBTs 101 to 106 respectively in an antiparallel manner. Each pair of the IGBTs 101 and 102, the IGBTs 103 and 104, and the IGBTs 105 and 106 are connected in series to make up three sets of arm units, between the positive power supply terminal P and the negative power supply terminal N. Also, intermediate connection portions of the arm units of U, V, and W phases are connected to the output terminals U, V, and W, respectively.

Temperature detection diodes having PN junctions are formed at the centers of the surfaces (emitter terminals) of the IGBTs 101 to 106, with insulating layers in between. Thereby, with regard to the IGBTs 101 to 106, chip temperature that is close to junction temperature can be observed by monitoring temperature-dependent forward voltage of the temperature detection diodes.

Also, the gate terminals of the IGBTs 101 to 106 and the temperature detection diodes are connected to control ICs 121 to 126. The control ICs 121 to 126 control and switch the IGBTs 101 to 106 and flow constant current in the temperature detection diodes in order to detect overheated states of the IGBTs 101 to 106.

Also, the IPM 100 includes a dedicated temperature detection IC 131 that detects case temperature, in addition to the temperature detection ICs that detect chip temperature. This temperature detection IC 131 is provided at a part of an insulating substrate and detects an overheated state of the case of the IPM 100 by detecting the temperature there. A thermistor is generally used as a temperature detection element of the temperature detection IC 131 (for example, refer to Japanese Laid-open Patent Publication No. 2002-184940 (paragraph [0109])), but here the temperature detection IC 131 uses a diode which has the same structure as the temperature detection diodes of the IGBTs 101 to 106 and is formed on a bare chip of the temperature detection IC 131.

FIG. 12 is a circuit diagram illustrating an overheat protection circuit of the past IPM, and FIGS. 13A and 13B illustrate temperature characteristics of the temperature detection diodes, where FIG. 13A illustrates overheat detection voltage in relation to temperature at the time of chip overheat protection, and FIG. 13B illustrates overheat detection voltage in relation to temperature at the time of case overheat protection.

The control ICs 121 to 126 are connected to the IGBTs 101 to 106 respectively, as illustrated in FIG. 12. That is, each of the control ICs 121 to 126 includes an output terminal OUT for outputting gate voltage, a ground terminal GND, an overcurrent detection terminal OC, and an overheat detection terminal OH.

The output terminal OUT is connected to the gate terminal of each IGBT 101 to 106, and the ground terminal GND is connected to the emitter terminal of each IGBT 101 to 106, and the overcurrent detection terminal OC is connected to a current-sense emitter terminal of each IGBT 101 to 106.

In each control IC 121 to 126, the overheat detection terminal OH is connected to a constant current source 141 and an inverting input terminal of an overheat detection comparator 142, and a non-inverting input terminal of the overheat detection comparator 142 is connected to a reference voltage supply 143. Also, the overheat detection terminal OH is connected to an anode terminal of a temperature detection diode 107 of each IGBT 101 to 106, and a cathode terminal of the temperature detection diode 107 is connected to a ground electric potential of the control ICs 121 to 126 via the ground terminal GND.

The constant current generated by the constant current source 141 always flows in the temperature detection diode 107, and forward voltage corresponding to chip temperature of each IGBT 101 to 106 is applied to the inverting input terminal of the overheat detection comparator 142. Here, temperature characteristics of the temperature detection diode 107 is negative as illustrated in FIG. 13A, and the reference voltage supply 143 outputs a voltage VOH1 corresponding to the temperature of 175° C. Thus, the overheat detection comparator 142 outputs a protection operation signal of low level when the chip temperature is lower than 175° C., and outputs a protection operation signal of high level when the chip temperature is equal to or higher than high temperature of 175° C. When this protection operation signal of high level is output, the control ICs 121 to 126 control and turn off all of the IGBTs 101 to 106 simultaneously with outputting an alarm signal from an alarm output circuit.

On the other hand, the temperature detection IC 131 includes a temperature detection diode 132, a constant current source 133, and an overheat detection comparator 134. An anode terminal of the temperature detection diode 132 is connected to the constant current source 133 and an inverting input terminal of the overheat detection comparator 134, and a cathode terminal of the temperature detection diode 132 is connected to the ground. A non-inverting input terminal of the overheat detection comparator 134 is connected to a reference voltage supply 135.

The constant current by the constant current source 133 always flows in the temperature detection diode 132, and forward voltage corresponding to case temperature is applied to the inverting input terminal of the overheat detection comparator 134. Here, the temperature characteristics of the temperature detection diode 132 is negative as illustrated in FIG. 13 (B), and the reference voltage supply 135 outputs a voltage VOH2 corresponding to the temperature of 125° C. Thereby, the overheat detection comparator 134 outputs a protection operation signal of low level when the case temperature is lower than 125° C., and outputs a protection operation signal of high level when the case temperature is equal to or higher than medium temperature of 125° C. When this protection operation signal of high level is output, the temperature detection IC 131 controls and turns off all of the IGBTs 101 to 106 simultaneously with outputting an alarm signal from the alarm output circuit.

However, the past IPM needs to include a dedicated temperature detection IC for the purpose of case overheat detection, and in addition the case overheat is detected at a single spot where the temperature detection IC is located, and thus there has been a problem that overheat is undetectable at other spots.

SUMMARY OF THE INVENTION

According to one aspect, there is provided a semiconductor module including: a plurality of switching elements provided with respective temperature detection elements for chip temperature detection, a plurality of diodes for protecting the switching elements, and a plurality of control circuits for controlling the switching elements, in one package, wherein the control circuits include respective comparators that compare temperatures detected by the temperature detection elements with a predetermined reference temperature for a case, and at least one of the control circuits includes a logical AND circuit that receives outputs of at least two of the comparators and determines case overheat.

The object and advantages of the invention will be realized and attained by means of the elements and combinations particularly pointed out in the claims.

It is to be understood that both the foregoing general description and the following detailed description are provided by way of example and explanatory and are not restrictive of the invention.

BRIEF DESCRIPTION OF DRAWINGS

FIG. 13A illustrates overheat detection voltage in relation to temperature at the time of chip overheat protection, and FIG. 13B illustrates overheat detection voltage in relation to temperature at the time of case overheat protection.

DETAILED DESCRIPTION OF THE INVENTION

The following description will explain in detail exemplary cases in which embodiments of the present disclosure are applied to an IPM having an inverter function for outputting three-phase alternate-current voltage by controlling and switching six IGBTs, with reference to drawings. Note that each embodiment can be carried out by combining a plurality of embodiments without inconsistency.

Figure 1:
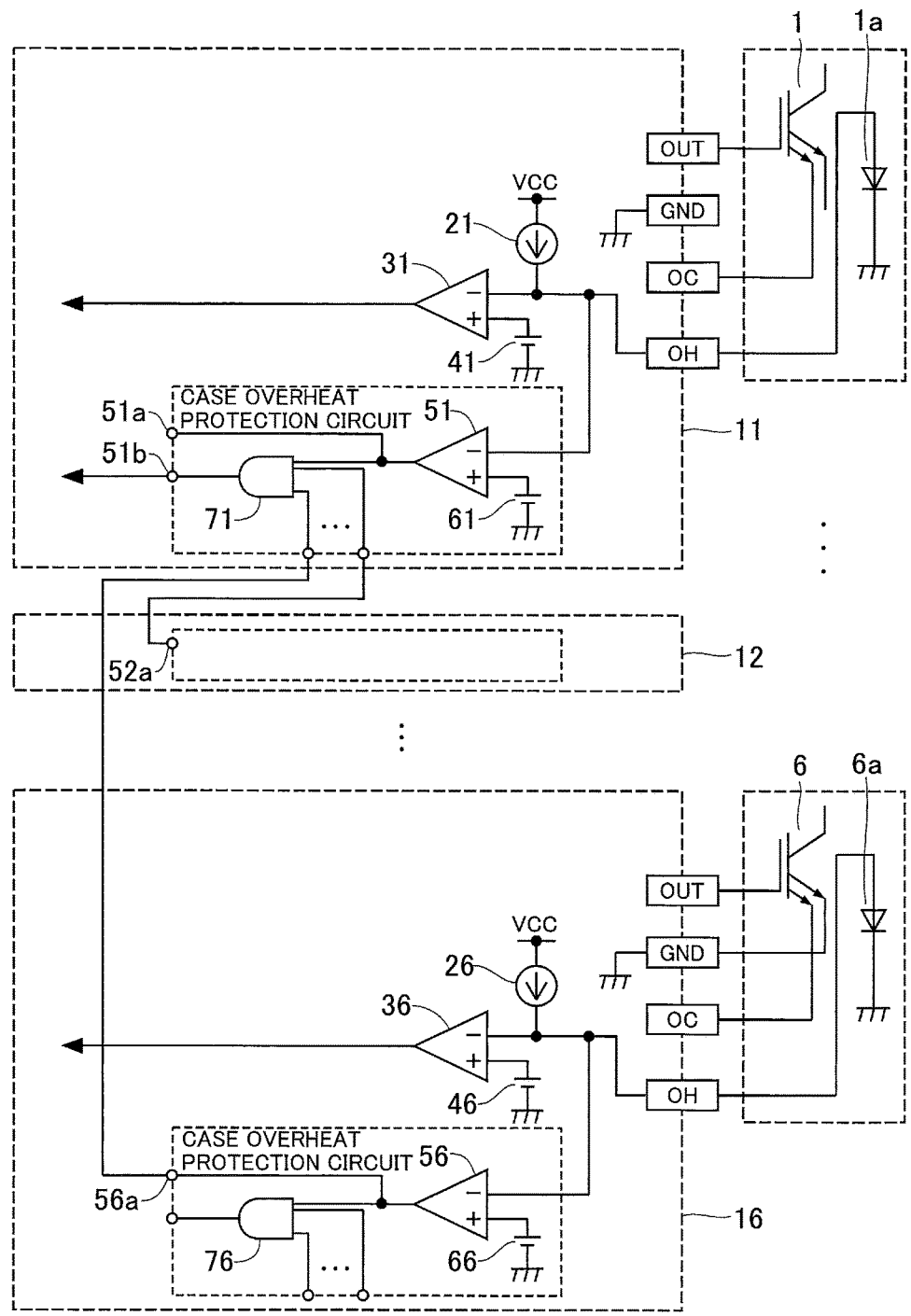
FIG. 1 illustrates an exemplary circuit configuration of a semiconductor module according to a first embodiment.
Figure 2:
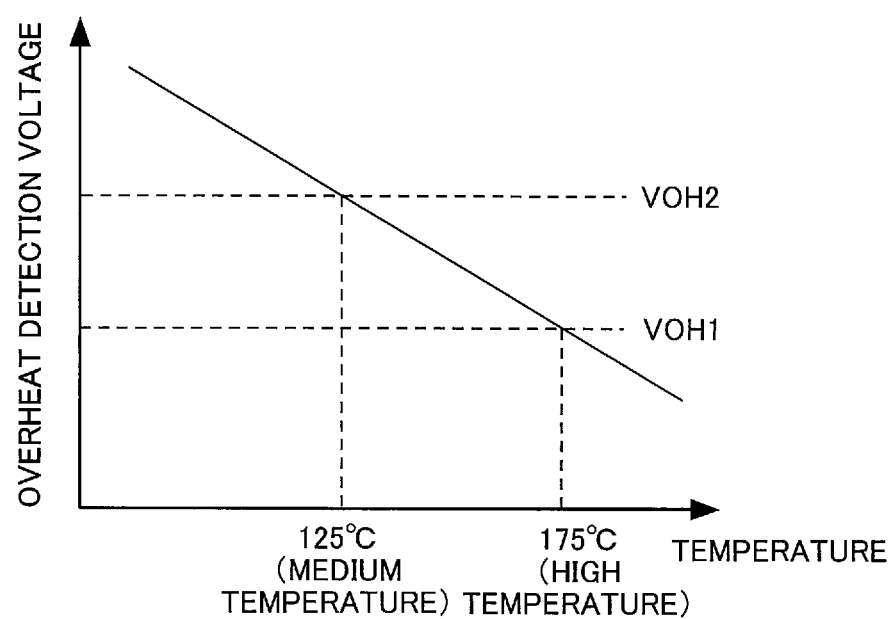
FIG. 2 illustrates temperature characteristics of a temperature detection diode.

FIG. 1 illustrates an exemplary circuit configuration of a semiconductor module according to a first embodiment, and FIG. 2 illustrates temperature characteristics of a temperature detection diode.

The semiconductor module according to the first embodiment includes a plurality of, here six, IGBTs 1 to 6, and temperature detection diodes 1a to 6a are formed in close contact with the respective IGBTs 1 to 6.

Control ICs (control circuits) 11 to 16 have output terminals OUT for outputting gate voltage, ground terminals GND, overcurrent detection terminals OC, and overheat detection terminals OH. Here, the output terminals OUT are connected to gate terminals of the IGBTs 1 to 6, and the ground terminals GND are connected to cathode terminals of the temperature detection diodes 1a to 6a, and the overcurrent detection terminals OC are connected to current-sense emitter terminals of the IGBTs 1 to 6. Also, the ground terminals GND are connected to emitter terminals of the IGBTs 2, 4, and 6.

The control ICs 11 to 16 include constant current sources 21 to 26, overheat detection comparators 31 to 36 for chip overheat detection, reference voltage supplies 41 to 46, overheat detection comparators 51 to 56 for case overheat detection, reference voltage supplies 61 to 66, and AND (logical AND) circuits 71 to 76. Here, the overheat detection comparators 31 to 36 and the reference voltage supplies 41 to 46 compose chip overheat protection circuits, and the overheat detection comparators 51 to 56, the reference voltage supplies 61 to 66, and the AND circuits 71 to 76 compose case overheat protection circuits.

The constant current sources 21 to 26 are connected to inverting input terminals of the overheat detection comparators 31 to 36, 51 to 56 and the overheat detection terminals OH. Non-inverting input terminals of the overheat detection comparators 31 to 36, 51 to 56 are connected to the reference voltage supplies 41 to 46, 61 to 66. Output terminals of the overheat detection comparators 31 to 36 are connected to alarm output circuits and gate blocking control circuits (not depicted). Output terminals of the overheat detection comparators 51 to 56 are connected to overheat detection terminals 51a to 56a and first input terminals of the AND circuits 71 to 76. The output terminals of the AND circuits 71 to 76 are connected to the alarm output circuits and the gate blocking circuits (not depicted). The AND circuits 71 to 76 include a plurality of, here six, input terminals. The overheat detection terminals 52a to 56a of the control ICs 12 to 16 are connected to the second to sixth inputs of the AND circuit 71, respectively.

The overheat detection terminals OH of the control ICs 11 to 16 are connected to anode terminals of the temperature detection diodes 1a to 6a of the IGBTs 1 to 6, and the cathode terminals of the temperature detection diodes 1a to 6a are connected to the ground electric potential of the control ICs 11 to 16 via the ground terminals GND.

The constant currents generated by the constant current sources 21 to 26 always flow in the temperature detection diodes 1a to 6a, and the forward voltages corresponding to chip temperatures of the IGBTs 1 to 6 are output to the overheat detection terminals OH as overheat detection voltages. The overheat detection voltages of the overheat detection terminals OH are applied to the inverting input terminals of the overheat detection comparators 31 to 36 for chip overheat detection and the inverting input terminals of the overheat detection comparators 51 to 56 for case overheat detection. Here, the temperature characteristics of the temperature detection diodes 1a to 6a are negative so that the overheat detection voltage becomes lower as temperature becomes higher, as illustrated in FIG. 2. Also, the reference voltage supplies 41 to 46 of the chip overheat protection circuits output voltage VOH1 corresponding to the temperature of 175° C., and the reference voltage supplies 61 to 66 of the case overheat protection circuits output voltage VOH2 corresponding to the temperature of 125° C. (a predetermined reference temperature). Note that overheat detection threshold voltages output by the reference voltage supplies 41 to 46, 61 to 66 can be set to voltage corresponding to another value other than 175° C. and 125° C.

Thus, the overheat detection comparators 31 to 36 output protection operation signals of low level, when the chip temperatures of the IGBTs 1 to 6 are lower than 175° C., and output protection operation signals of high level, when the chip temperature of any one of the IGBTs 1 to 6 becomes equal to or higher than 175° C. When the protection operation signal of high level is output, the control ICs 11 to 16 control and turn off all of the IGBTs 1 to 6 simultaneously with outputting an alarm signal from the alarm output circuit.

Also, the overheat detection comparators 51 to 56 output protection operation signals of low level, when the chip temperatures of the IGBTs 1 to 6 are lower than 125° C., and output protection operation signals of high level, when the chip temperatures becomes equal to or higher than the medium temperature of 125° C. The protection operation signals of the overheat detection comparators 51 to 56 are input into the AND circuit 71 in the case overheat protection circuit of the control IC 11. Thus, when all of the overheat detection comparators 51 to 56 detect chip temperature of the medium temperature or more, the AND circuit 71 determines that the case is in an overheated state, and outputs a protection operation signal of high level to an overheat detection terminal 51b. The protection operation signal of the overheat detection terminal 51b controls and turns off all of the IGBTs 1 to 6 simultaneously with outputting an alarm signal from the alarm output circuit.

Note that the semiconductor module according to the first embodiment determines an overheated state of the case by calculating the logical AND of the detection results by all of the temperature detection diodes 1a to 6a. However, the overheated state of the case may be determined by calculating the logical AND of the overheat detection voltages of two or more of the temperature detection diodes 1a to 6a.

Also, the temperature detection IC for case overheat protection, which was independently provided in the past semiconductor module, is removed, and the number of components is reduced. Also, the temperatures of the chips, which are heat generation sources of the IPM, are directly detected with respect to the operation temperature of the case overheat protection, and therefore the detection accuracy is improved.

Figure 3:
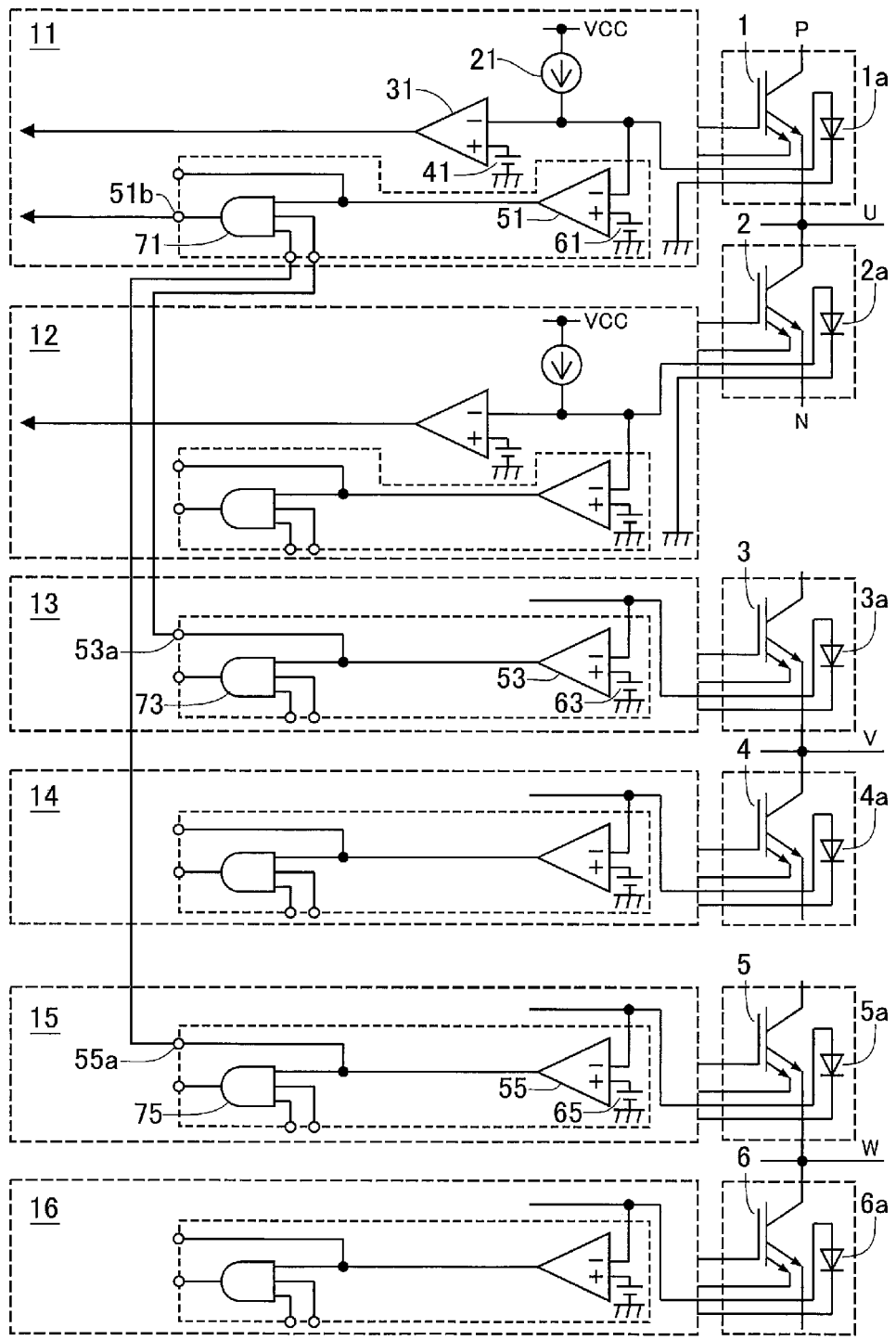
FIG. 3 illustrates an exemplary circuit configuration of a semiconductor module according to a second embodiment.

FIG. 3 illustrates an exemplary circuit configuration of a semiconductor module according to a second embodiment. Note that components that are the same as or equivalent to the components illustrated in FIG. 1 are denoted with the same reference signs. Also, part of components of the V phase and the W phase in the control ICs 13 to 16 are omitted.

The semiconductor module according to the second embodiment determines the overheated state of the case by using the overheat detection voltages generated by the temperature detection diodes 1a, 3a, and 5a of three IGBTs 1, 3, and 5 of the upper arm units, among the IGBTs 1 to 6 that compose the arm units of the U phase, the V phase, and the W phase. Hence, the AND circuits 71 to 76 of the control ICs 11 to 16 are configured with 3-input AND circuits.

The AND circuit 71 of the control IC 11 receives, as inputs, the outputs of the overheat detection comparators 51, 53, and 55, and outputs a protection operation signal of high level, when all of the temperature detection diodes 1a, 3a, and 5a of the three IGBTs 1, 3, and 5 detect overheat temperature of 125° C. or more. When the AND circuit 71 outputs the protection operation signal of high level, the control ICs 11 to 16 determine that the case is in an overheated state, and control and turn off all of the IGBTs 1 to 6 simultaneously with outputting an alarm signal from the alarm output circuit.

Note that, in this embodiment, the logical AND calculation of the overheat detection voltages is performed in the AND circuit 71 of the control IC 11, but may utilize any one of the AND circuits 71 to 76 of the control ICs 11 to 16.

Figure 4:
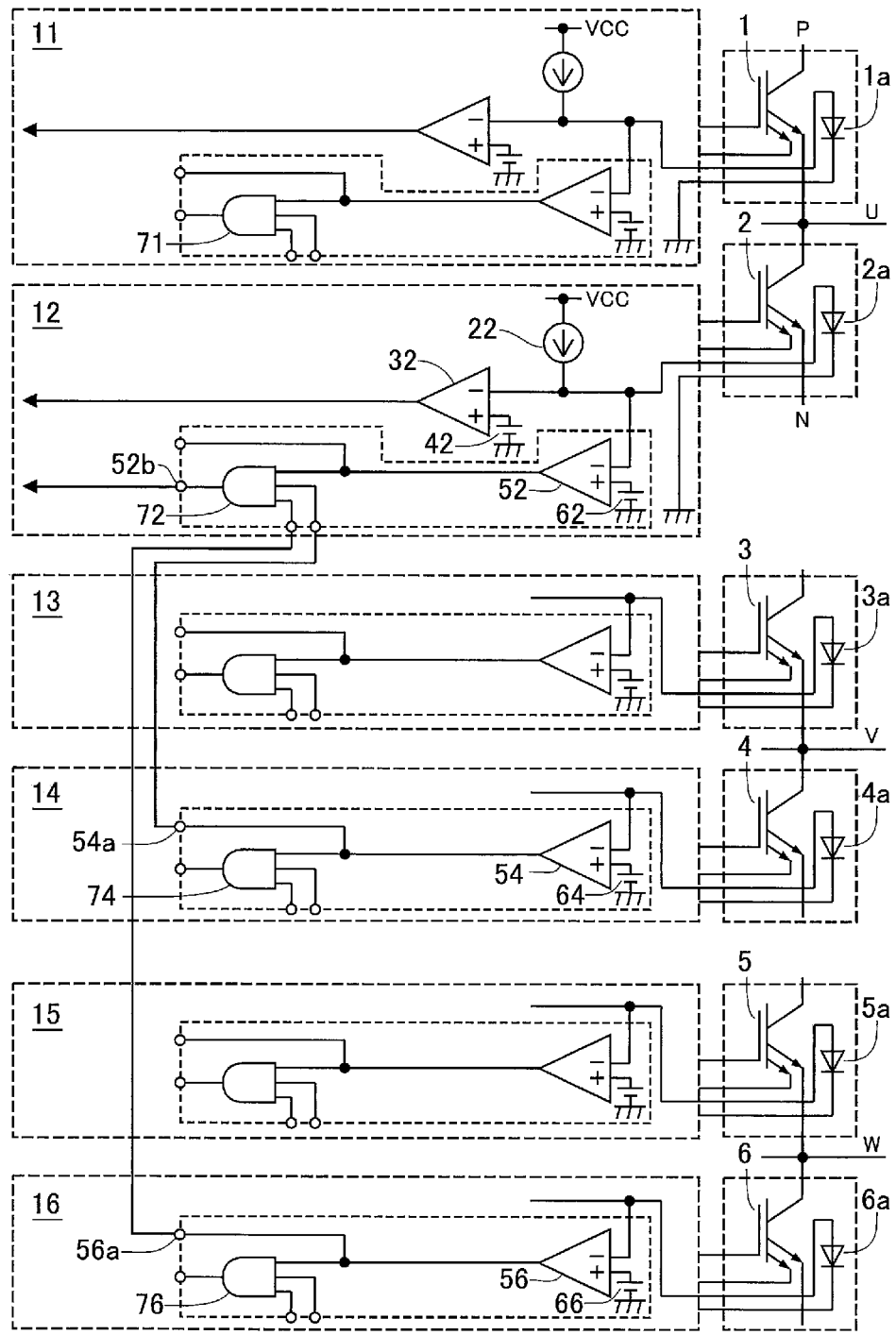
FIG. 4 illustrates an exemplary circuit configuration of a semiconductor module according to a third embodiment.

FIG. 4 illustrates an exemplary circuit configuration of a semiconductor module according to a third embodiment. Note that components that are the same as or equivalent to the components illustrated in FIG. 1 are denoted with the same reference signs. Also, part of components of the V phase and the W phase in the control ICs 13 to 16 are omitted.

The semiconductor module according to the third embodiment determines the overheated state of the case by using the overheat detection voltages generated by the temperature detection diodes 2a, 4a, and 6a of three IGBTs 2, 4, and 6 of the lower arm units, among the IGBTs 1 to 6 that compose the arm units of the U phase, the V phase, and the W phase. Hence, the AND circuits 71 to 76 of the control ICs 11 to 16 are configured with 3-input AND circuits.

The AND circuit 72 of the control IC 12 receives, as inputs, the outputs of the overheat detection comparators 52, 54, and 56, and outputs a protection operation signal of high level, when all of the temperature detection diodes 2a, 4a, and 6a of the three IGBTs 2, 4, and 6 detect overheat temperature of 125° C. or more. When the AND circuit 72 outputs the protection operation signal of high level, the control ICs 11 to 16 determine that the case is in an overheated state, and control and turn off all of the IGBTs 1 to 6 simultaneously with outputting an alarm signal from the alarm output circuit.

Note that, in this embodiment, the logical AND calculation of the overheat detection voltages is performed in the AND circuit 72 of the control IC 12, but may utilize any one of the AND circuits 71 to 76 of the control ICs 11 to 16, and may utilize the AND circuit 71 of the control IC 11 for example.

Figure 5:
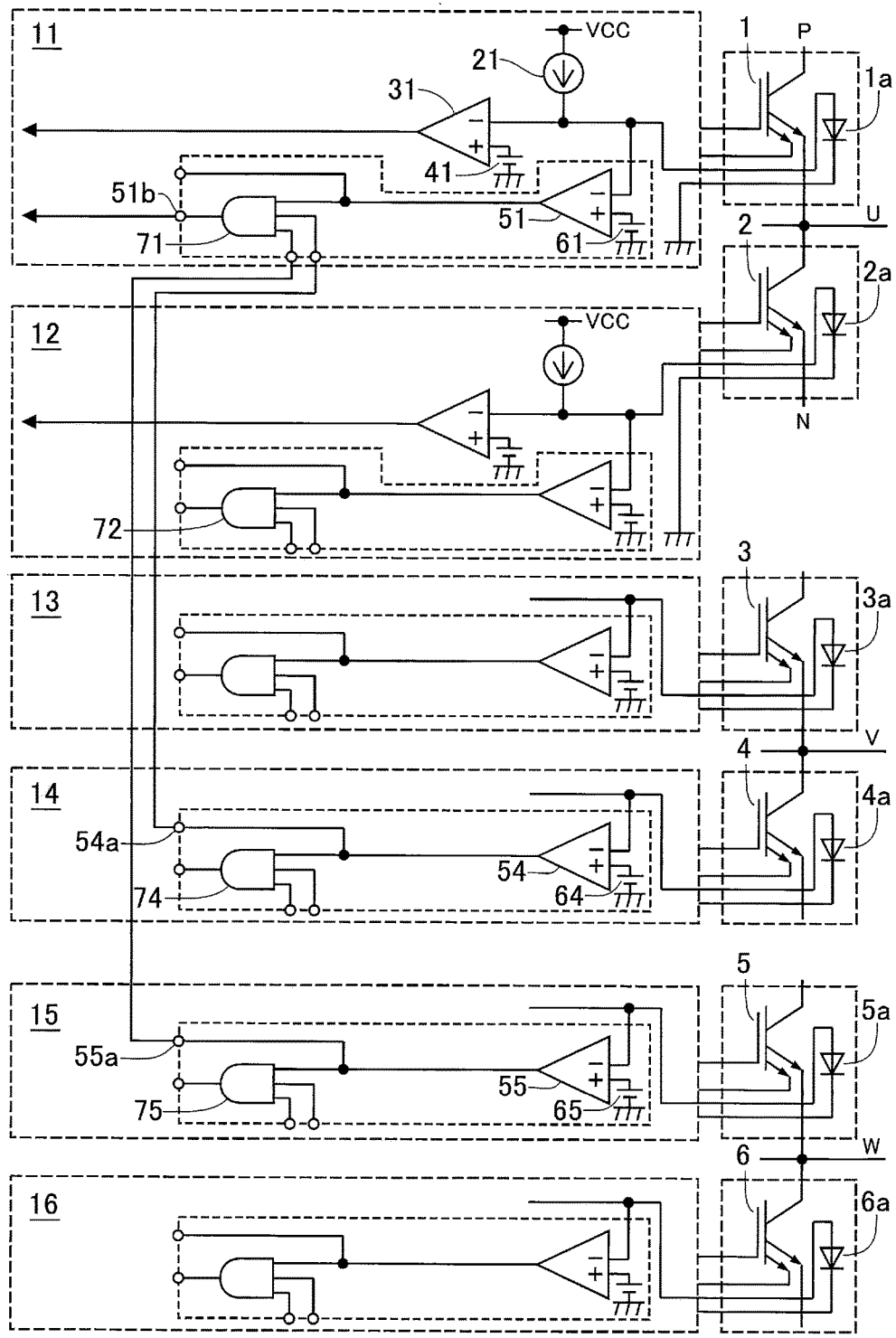
FIG. 5 illustrates an exemplary circuit configuration of a semiconductor module according to a fourth embodiment.

FIG. 5 illustrates an exemplary circuit configuration of a semiconductor module according to a fourth embodiment. Note that components that are the same as or equivalent to the components illustrated in FIG. 1 are denoted with the same reference signs. Also, part of components of the V phase and the W phase in the control ICs 13 to 16 are omitted.

The semiconductor module according to the fourth embodiment determines the overheated state of the case on the basis of the chip temperatures of totally 3 spots including two of the upper arm units and one of the lower arm units, among the IGBTs 1 to 6 that compose the arm units of the U phase, the V phase, and the W phase. In this embodiment, the overheated state of the case is determined on the basis of the overheat detection voltages generated by the temperature detection diodes 1a and 5a of the IGBTs 1 and 5 of two of the upper arm units and the temperature detection diode 4a of the IGBT 4 of one of the lower arm units. In order to merge the overheat detection voltages of the 3 spots, the AND circuits 71 to 76 of the control ICs 11 to 16 are configured with 3-input AND circuits.

The AND circuit 71 of the control IC 11 receives, as inputs, the outputs of the overheat detection comparators 51, 54, and 55, and outputs a protection operation signal of high level, when all of the temperature detection diodes 1a, 4a, and 5a of three IGBTs 1, 4, and 5 detect overheat temperature of 125° C. or more. When the AND circuit 71 outputs the protection operation signal of high level, the control ICs 11 to 16 determine that the case is in an overheated state, and control and turn off all of the IGBTs 1 to 6 simultaneously with outputting an alarm signal from the alarm output circuit.

Note that, in this embodiment, the logical AND calculation of the overheat detection voltages is performed in the AND circuit 71 of the control IC 11, but may utilize any one of the AND circuits 71 to 76 of the control ICs 11 to 16, and may utilize the AND circuit 72 of the control IC 12 for example. Also, in this embodiment, the chip temperatures of the IGBTs 1 and 5 of two of the upper arm units are observed, but the chip temperatures of the IGBTs 1 and 3 or the IGBTs 3 and 5 may be observed. In the same way, in this embodiment, the chip temperature of the IGBT 4 of one of the lower arm units is observed, but the chip temperature of the IGBT 2 or the IGBT 6 may be observed.

Figure 6:
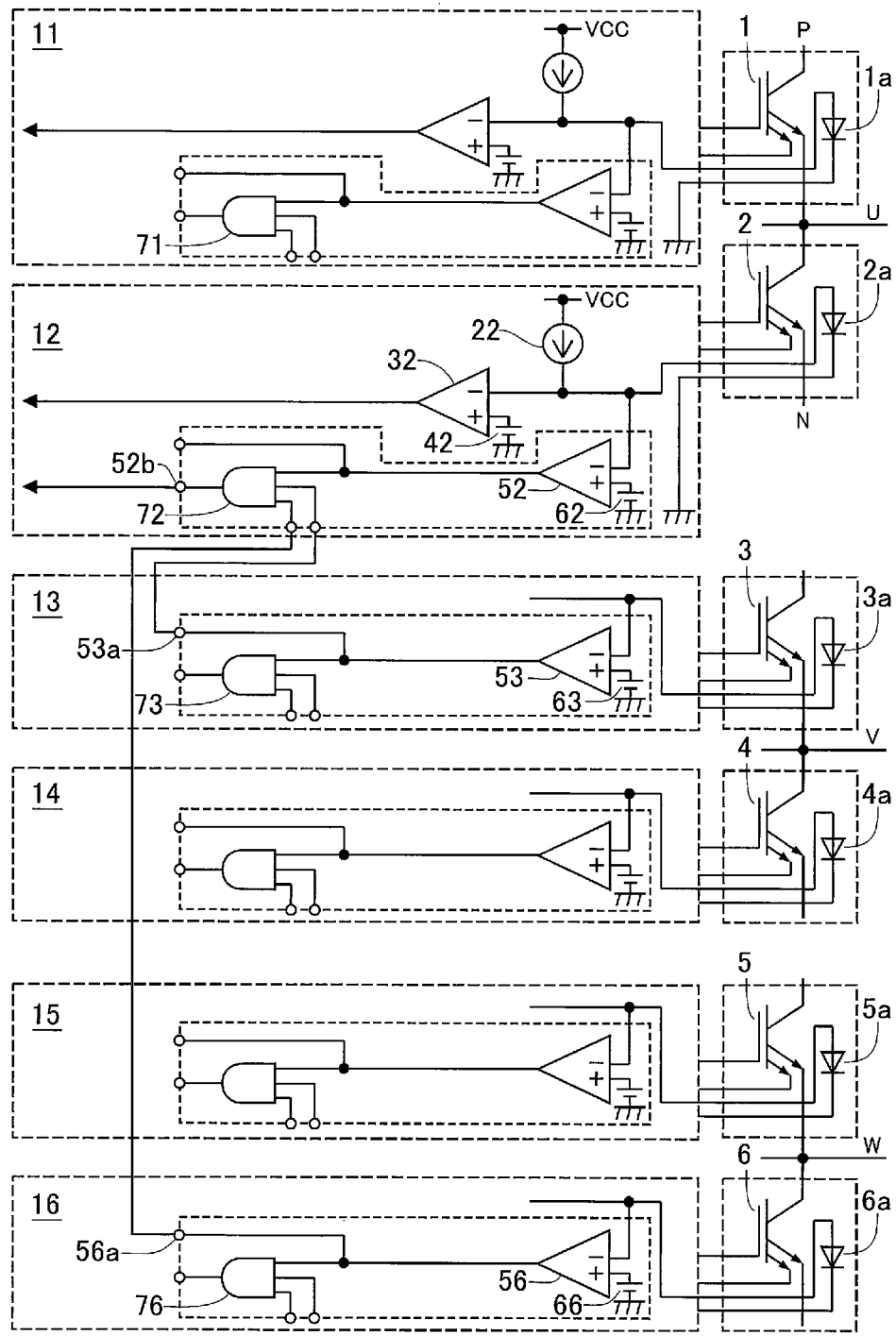
FIG. 6 illustrates an exemplary circuit configuration of a semiconductor module according to a fifth embodiment.

FIG. 6 illustrates an exemplary circuit configuration of a semiconductor module according to a fifth embodiment. Note that components that are the same as or equivalent to the components illustrated in FIG. 1 are denoted with the same reference signs. Also, part of components of the V phase and the W phase in the control ICs 13 to 16 are omitted.

The semiconductor module according to the fifth embodiment determines the overheated state of the case on the basis of the chip temperatures of totally 3 spots including one of the upper arm units and two of the lower arm units, among the IGBTs 1 to 6 that compose the arm units of the U phase, the V phase, and the W phase. In this embodiment, the overheated state of the case is determined on the basis of the overheat detection voltages generated by the temperature detection diode 3a of the IGBT 3 of one of the upper arm units and the temperature detection diodes 2a and 6a of the IGBTs 2 and 6 of two of the lower arm units. In order to merge the overheat detection voltages of the 3 spots, the AND circuits 71 to 76 of the control ICs 11 to 16 are configured with 3-input AND circuits.

The AND circuit 72 of the control IC 12 receives, as inputs, the outputs of the overheat detection comparators 52, 53, and 56, and outputs a protection operation signal of high level, when all of the temperature detection diodes 2a, 3a, and 6a of the three IGBTs 2, 3, and 6 detect overheat temperature of 125° C. or more. When the AND circuit 72 outputs the protection operation signal of high level, the control ICs 11 to 16 determine that the case is in an overheated state, and control and turn off all of the IGBTs 1 to 6 simultaneously with outputting an alarm signal from the alarm output circuit.

Note that, in this embodiment, the logical AND calculation of the overheat detection voltages is performed in the AND circuit 72 of the control IC 12, but may utilize any one of the AND circuits 71 to 76 of the control ICs 11 to 16, and may utilize the AND circuit 71 of the control IC 11 for example. Also, in this embodiment, the chip temperature of the IGBT 3 of one of the upper arm units is observed, but the chip temperature of the IGBT 1 or the IGBT 5 may be observed. In the same way, in this embodiment, the chip temperatures of the IGBTs 2 and 6 of two of the lower arm units are observed, but the chip temperatures of the IGBTs 2 and 4 or the IGBTs 4 and 6 may be observed.

Figure 7:
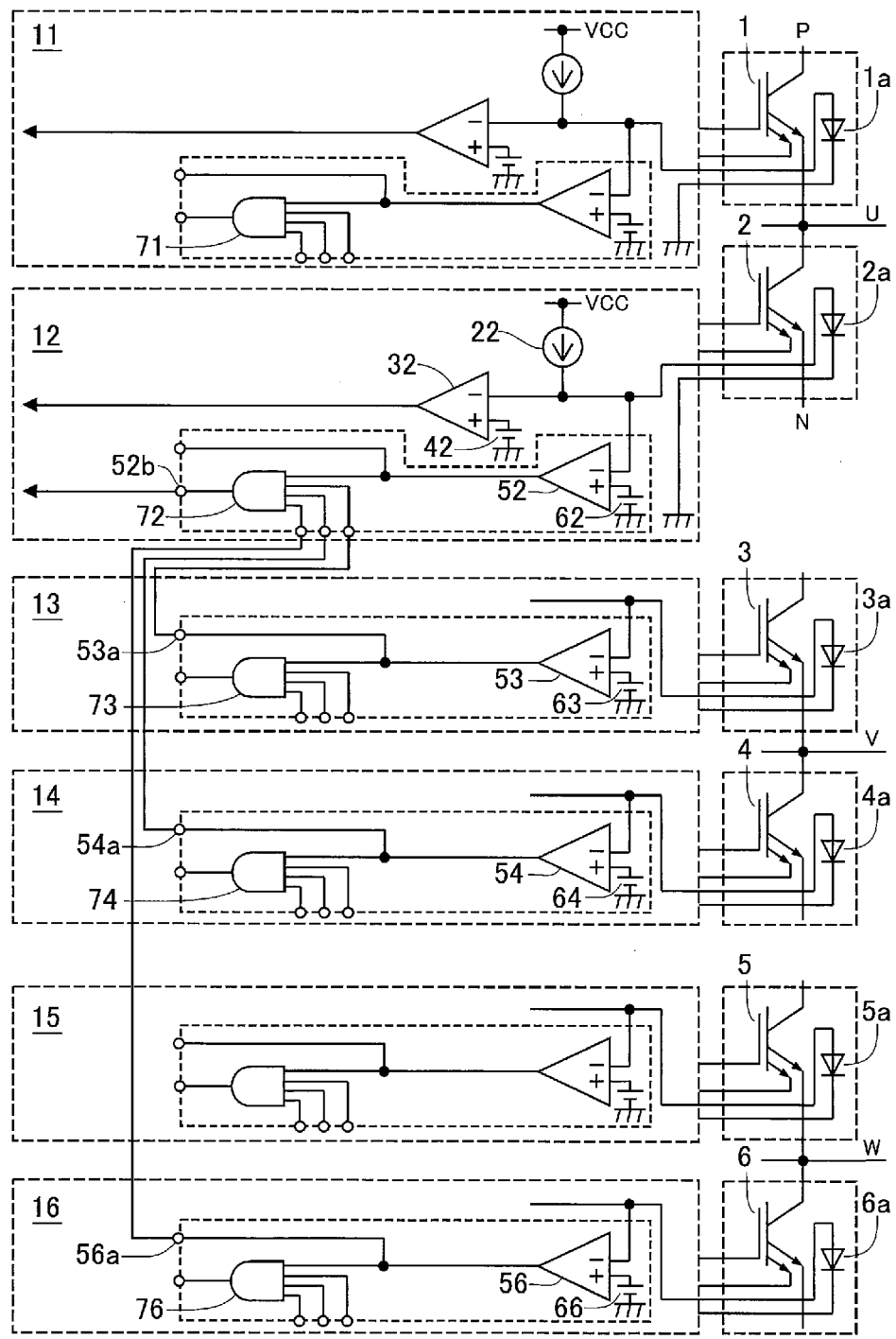
FIG. 7 illustrates an exemplary circuit configuration of a semiconductor module according to a sixth embodiment.

FIG. 7 illustrates an exemplary circuit configuration of a semiconductor module according to a sixth embodiment. Note that components that are the same as or equivalent to the components illustrated in FIG. 1 are denoted with the same reference signs. Also, part of components of the V phase and the W phase in the control ICs 13 to 16 are omitted.

The semiconductor module according to the sixth embodiment determines the overheated state of the case on the basis of the chip temperatures of totally 4 spots including one of the upper arm units and three of the lower arm units, among the IGBTs 1 to 6 that compose the arm units of the U phase, the V phase, and the W phase. In this embodiment, the overheated state of the case is determined on the basis of the overheat detection voltages generated by the temperature detection diode 3a of the IGBT 3 of one of the upper arm units and the temperature detection diodes 2a, 4a, and 6a of the IGBTs 2, 4, and 6 of three of the lower arm units. In order to merge the overheat detection voltages of the 4 spots, the AND circuits 71 to 76 of the control ICs 11 to 16 are configured with 4-input AND circuits.

The AND circuit 72 of the control IC 12 receives, as inputs, the outputs of the overheat detection comparators 52, 53, 54, and 56, and outputs a protection operation signal of high level, when all of the temperature detection diodes 2a, 3a, 4a, and 6a of four IGBTs 2, 3, 4, and 6 detect overheat temperature of 125° C. or more. When the AND circuit 72 outputs the protection operation signal of high level, the control ICs 11 to 16 determine that the case is in an overheated state, and control and turn off all of the IGBTs 1 to 6 simultaneously with outputting an alarm signal from the alarm output circuit.

Note that, in this embodiment, the logical AND calculation of the overheat detection voltages is performed in the AND circuit 72 of the control IC 12, but may utilize any one of the AND circuits 71 to 76 of the control ICs 11 to 16, and may utilize the AND circuit 71 of the control IC for example. Also, in this embodiment, the chip temperature of the IGBT 3 of one of the upper arm units is observed, but the chip temperature of the IGBT 1 or the IGBT 5 may be observed.

Figure 8:
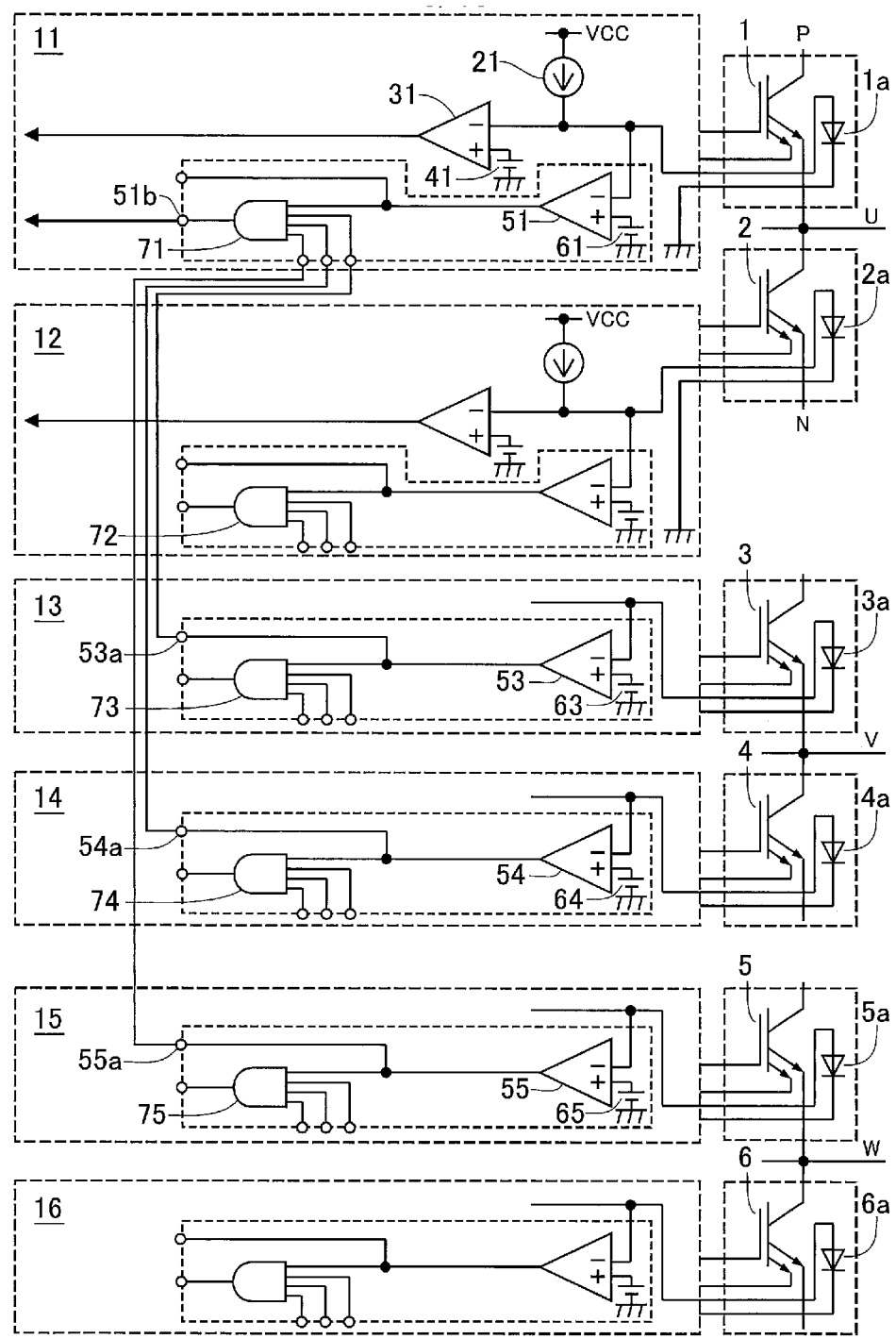
FIG. 8 illustrates an exemplary circuit configuration of a semiconductor module according to a seventh embodiment.

FIG. 8 illustrates an exemplary circuit configuration of a semiconductor module according to a seventh embodiment. Note that components that are the same as or equivalent to the components illustrated in FIG. 1 are denoted with the same reference signs. Also, part of components of the V phase and the W phase in the control ICs 13 to 16 are omitted.

The semiconductor module according to the seventh embodiment determines the overheated state of the case on the basis of the chip temperatures of totally 4 spots including three of the upper arm units and one of the lower arm units, among the IGBTs 1 to 6 that compose the arm units of the U phase, the V phase, and the W phase. In this embodiment, the overheated state of the case is determined on the basis of the overheat detection voltages generated by the temperature detection diodes 1*a*, 3*a*, and 5*a* of the IGBTs 1, 3, and 5 of three of the upper arm units and the temperature detection diode 4*a* of the IGBT 4 of one of the lower arm units. In order to merge the overheat detection voltages of the 4 spots, the AND circuits 71 to 76 of the control ICs 11 to 16 are configured with 4-input AND circuits.

The AND circuit 71 of the control IC 11 receives, as inputs, the outputs of the overheat detection comparators 51, 53, 54, and 55, and outputs a protection operation signal of high level, when all of the temperature detection diodes 1*a*, 3*a*, 4*a*, and 5*a* of four IGBTs 1, 3, 4, and 5 detect overheat temperature of 125° C. or more. When the AND circuit 71 outputs the protection operation signal of high level, the control ICs 11 to 16 determine that the case is in an overheated state, and control and turn off all of the IGBTs 1 to 6 simultaneously with outputting an alarm signal from the alarm output circuit.

Note that, in this embodiment, the logical AND calculation of the overheat detection voltages is performed in the AND circuit 71 of the control IC 11, but may utilize any one of the AND circuits 71 to 76 of the control ICs 11 to 16, and may utilize the AND circuit 72 of the control IC for example. Also, in this embodiment, the chip temperature of the IGBT 4 of one of the lower arm units is observed, but the chip temperature of the IGBT 2 or the IGBT 6 may be observed.

Figure 9:
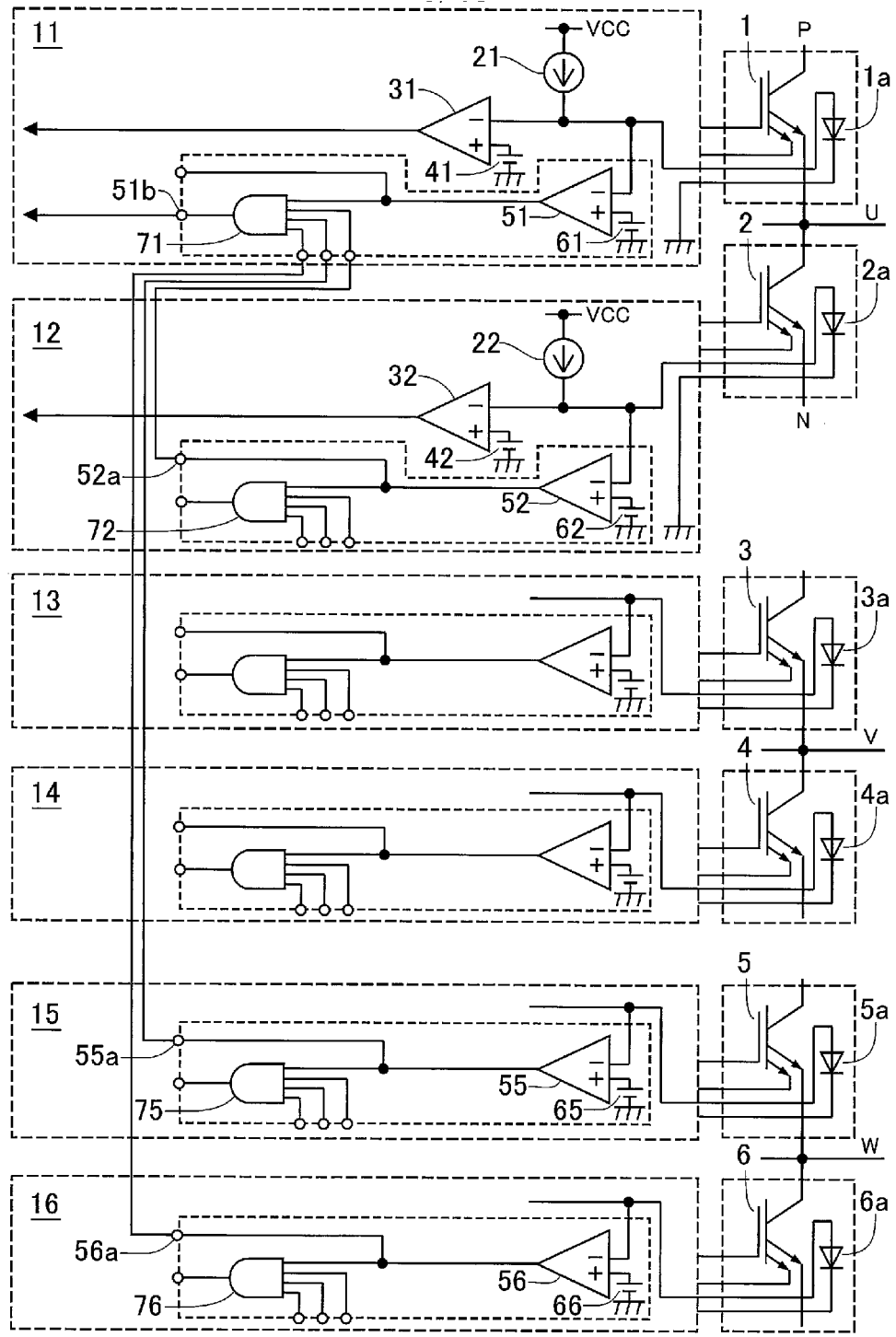
FIG. 9 illustrates an exemplary circuit configuration of a semiconductor module according to an eighth embodiment.

FIG. 9 illustrates an exemplary circuit configuration of a semiconductor module according to an eighth embodiment. Note that components that are the same as or equivalent to the components illustrated in FIG. 1 are denoted with the same reference signs. Also, part of components of the V phase and the W phase in the control ICs 13 to 16 are omitted.

The semiconductor module according to the eighth embodiment determines the overheated state of the case on the basis of the chip temperatures of totally 4 spots including two of the upper arm units and two of the lower arm units, among the IGBTs 1 to 6 that compose the arm units of the U phase, the V phase, and the W phase. In this embodiment, the overheated state of the case is determined on the basis of the overheat detection voltages generated by the temperature detection diodes 1*a* and 5*a* of the IGBTs 1 and 5 of two of the upper arm units and the temperature detection diodes 2*a* and 6*a* of the IGBTs 2 and 6 of two of the lower arm units. In order to merge the overheat detection voltages of the 4 spots, the AND circuits 71 to 76 of the control ICs 11 to 16 are configured with 4-input AND circuits.

The AND circuit 71 of the control IC 11 receives, as inputs, the outputs of the overheat detection comparators 51, 52, 55, and 56, and outputs a protection operation signal of high level, when all of the temperature detection diodes 1*a*, 2*a*, 5*a*, and 6*a* of four IGBTs 1, 2, 5, and 6 detect overheat temperature of 125° C. or more. When the AND circuit 71 outputs the protection operation signal of high level, the control ICs 11 to 16 determine that the case is in an overheated state, and control and turn off all of the IGBTs 1 to 6 simultaneously with outputting an alarm signal from the alarm output circuit.

Note that, in this embodiment, the logical AND calculation of the overheat detection voltages is performed in the AND circuit 71 of the control IC 11, but may utilize any one of the AND circuits 71 to 76 of the control ICs 11 to 16, and may utilize the AND circuit 72 of the control IC 12 for example. Also, in this embodiment, the chip temperatures of the IGBTs 1 and 5 of two of the upper arm units are observed, but the chip temperatures of the IGBTs 1 and 3 or the IGBTs 3 and 5 may be observed. In the same way, in this embodiment, the chip temperatures of the IGBTs 2 and 6 of two of the lower arm units are observed, but the chip temperatures of the IGBTs 2 and 4 or the IGBTs 4 and 6 may be observed.

Figure 10:
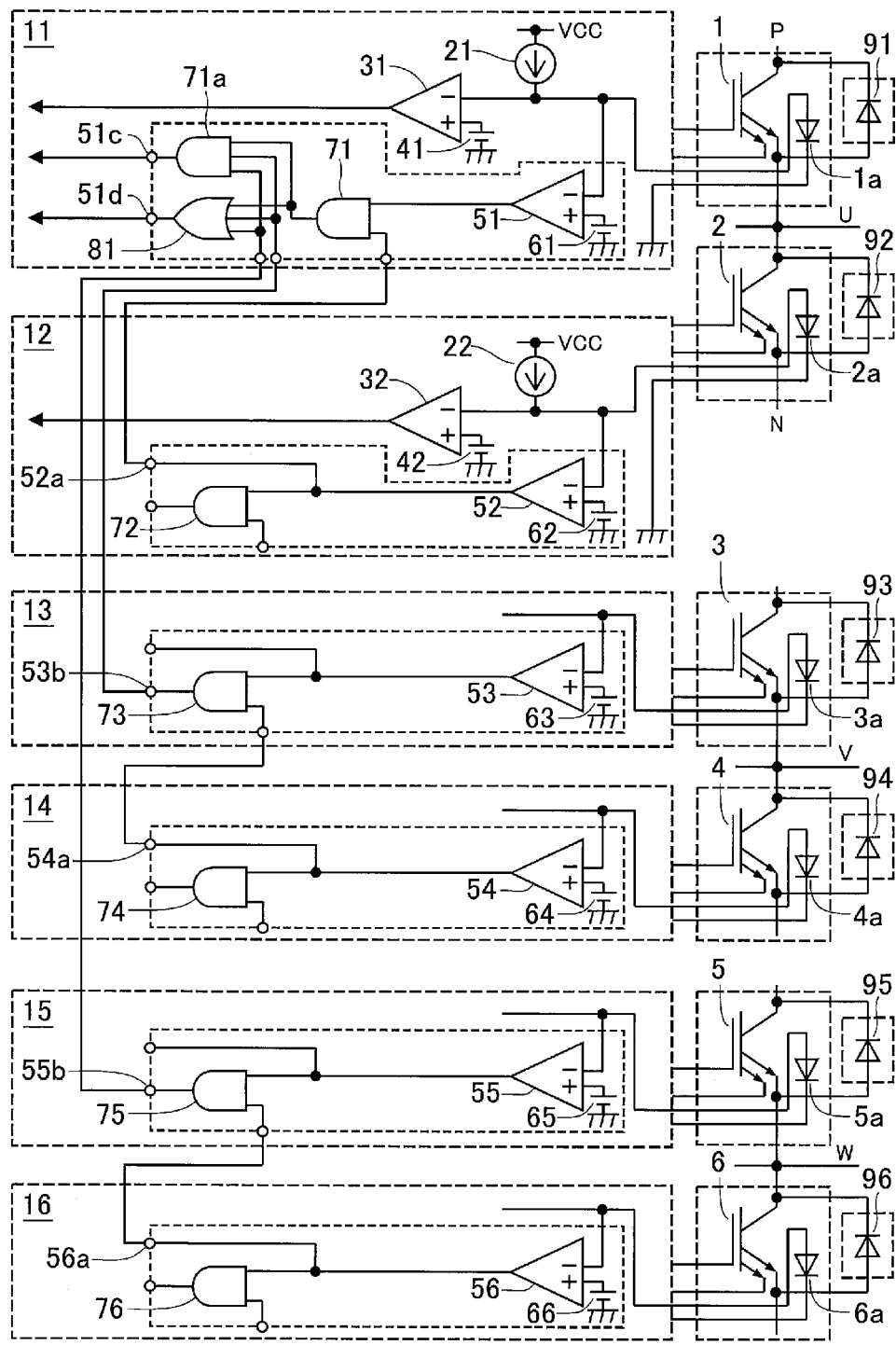
FIG. 10 illustrates an exemplary circuit configuration of a semiconductor module according to a ninth embodiment.

FIG. 10 illustrates an exemplary circuit configuration of a semiconductor module according to a ninth embodiment. Note that components that are the same as or equivalent to the components illustrated in FIG. 1 are denoted with the same reference signs. Also, part of components of the V phase and the W phase in the control ICs 13 to 16 are omitted.

Figure 11:
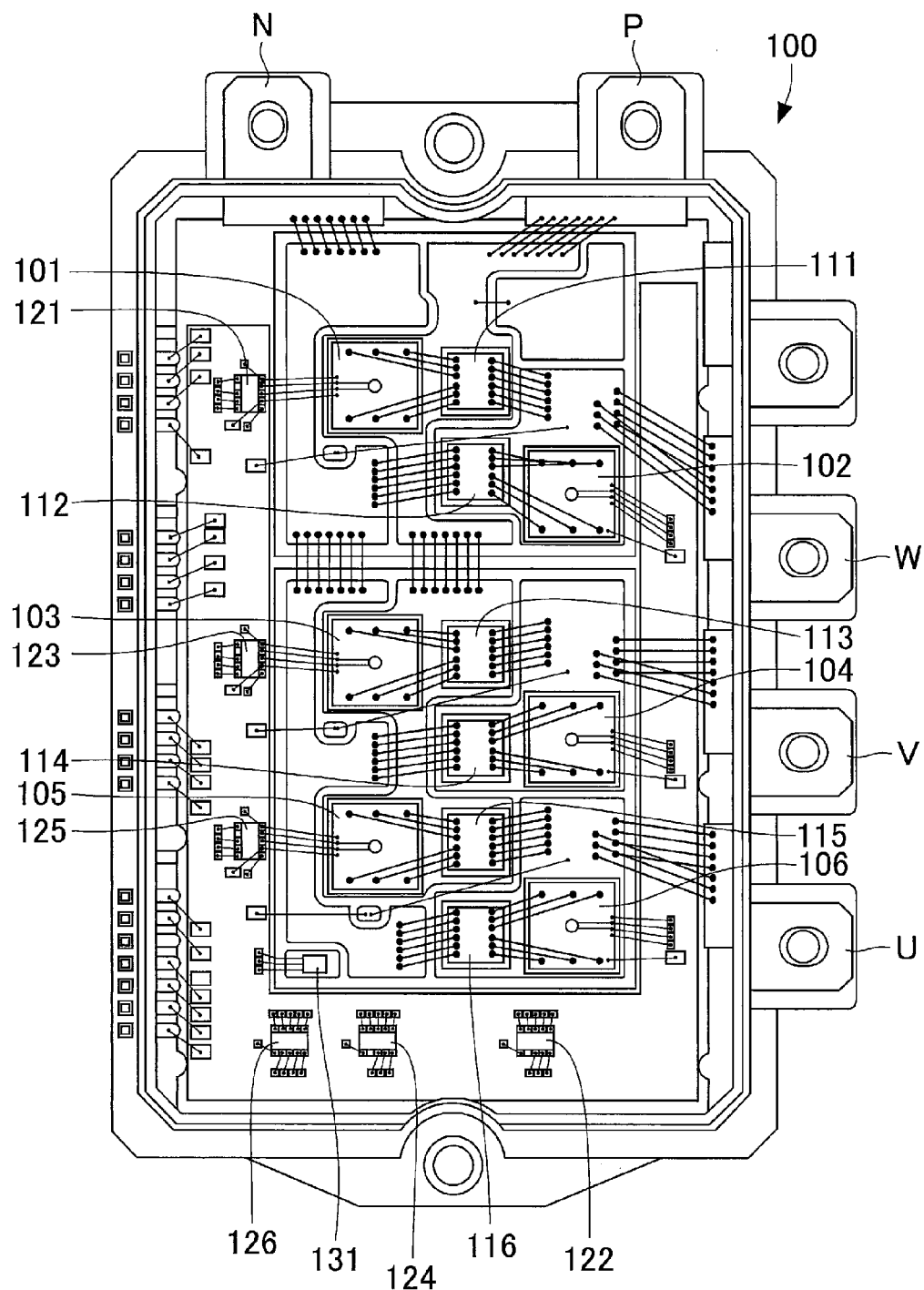
FIG. 11 illustrates an exemplary inner configuration of a past IPM.
Figure 12:
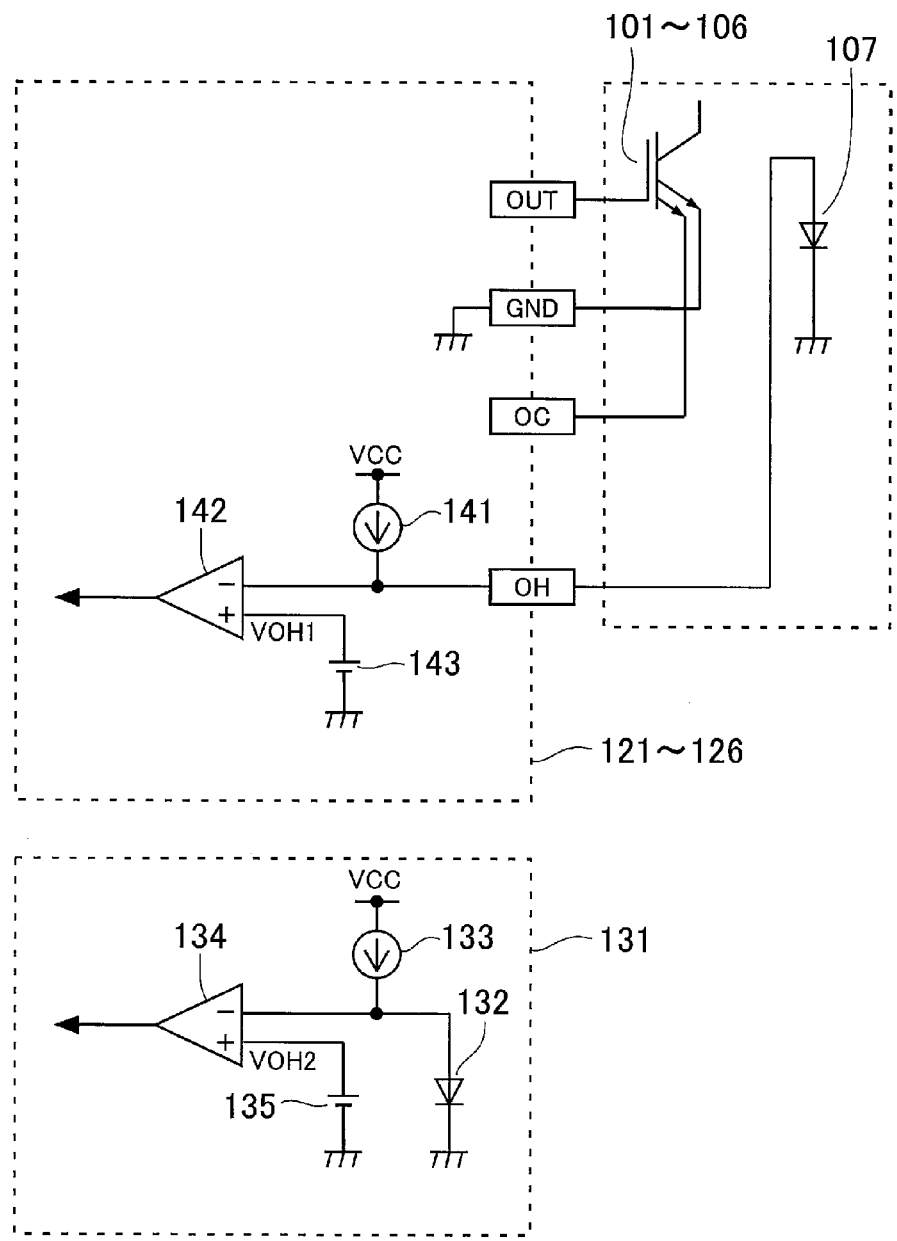
FIG. 12 is a circuit diagram illustrating an overheat protection circuit of the past IPM.
Figure 13A:
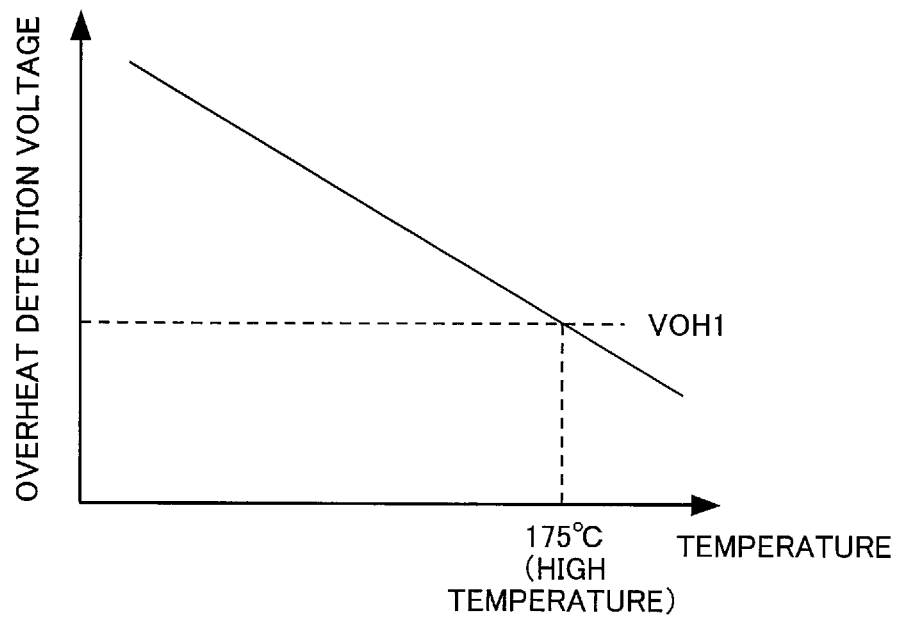
FIGS. 13A and 13B illustrate temperature characteristics of a temperature detection diode, where
Figure 13B:
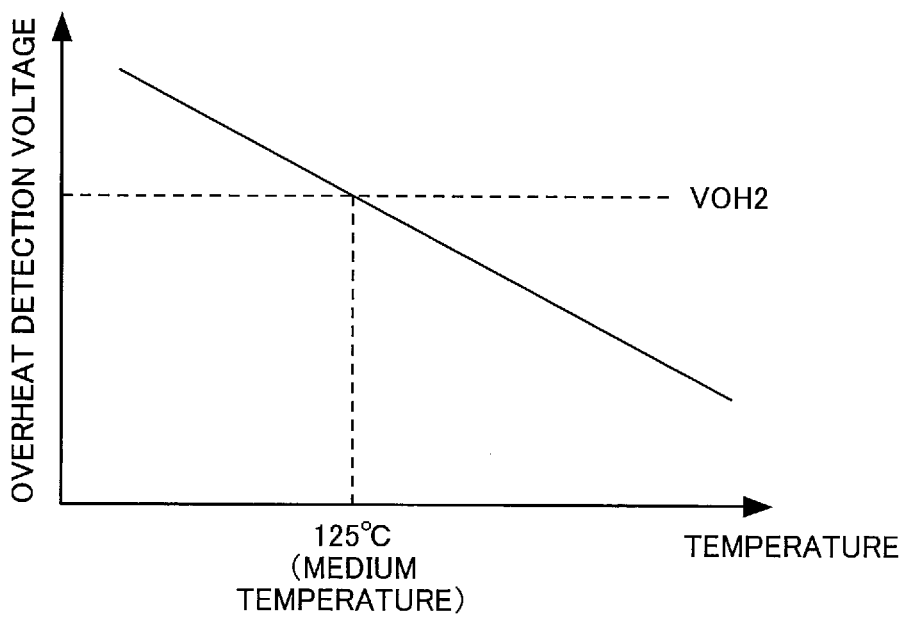

The semiconductor module according to the ninth embodiment detects case overheat by observing the chip temperatures of all of the IGBTs 1 to 6, as well as detects overheat of diodes 91 to 96 that are connected to the respective IGBTs 1 to 6 in an antiparallel manner. In particular, this is feasible when the semiconductor module is arranged such that the diodes 91 and 92, the diodes 93 and 94, and the diodes 95 and 96 are located between the IGBTs 1 and 2, the IGBTs 3 and 4, and the IGBTs 5 and 6 respectively, as in FIG. 11. In this case, it is rare that a pair of IGBTs (the IGBTs 1 and 2, the IGBTs 3 and 4, and the IGBTs 5 and 6) of the upper arm unit and the lower arm unit of each arm unit simultaneously generate abnormal heat, when the IGBTs 1 to 6 and the diodes 91 to 96 are normal. Hence, it is determined that, when a pair of IGBTs (the IGBTs 1 and 2, the IGBTs 3 and 4, and the IGBTs 5 and 6) of the upper arm unit and the lower arm unit generate heat of the medium temperature or more simultaneously, at least one of the diodes (the diodes 91 and 92, the diodes and 94, the diodes 95 and 96) of the arm unit is possibly overheated.

Thus, in the control ICs 11 to 16 of this semiconductor module, a case overheat protection circuit additionally have a diode overheat detection function. Note that this embodiment illustrates a case in which only one (the control IC 11) of the control ICs 11 to 16 has the diode overheat detection function in its case overheat protection circuit, and the other five (the control ICs 12 to 16) do not have the diode overheat detection function.

The case overheat protection circuit of the control IC 11 includes an overheat detection comparator 51, a reference voltage supply 61, a 2-input AND circuit 71, and a 3-input AND circuit 71*a* for case overheat detection, and includes a 3-input OR circuit (logical OR circuit) 81 for diode overheat detection. The case overheat protection circuits of the control ICs 12 to 16 include overheat detection comparators 52 to 56, reference voltage supplies 62 to 66, and 2-input AND circuits 72 to 76.

Here, the outputs of the overheat detection comparators 51 and 52 are input into the AND circuit 71 in the U phase, and the outputs of the overheat detection comparators 53 and 54 are input into the AND circuit 73 in the V phase, and the outputs of the overheat detection comparators 55 and 56 are input into the AND circuit 75 in the W phase. Further, the outputs of the AND circuits 71, 73, and 75 are input into the AND circuit 71a, and the output of the AND circuit 71a is connected to the overheat detection terminal 51c. Thereby, when the chip temperatures of all of the IGBTs 1 to 6 become equal to or higher than the medium temperature, the control IC 11 determines that the case is in an overheated state, and controls and turns off all of the IGBTs 1 to 6 simultaneously with outputting an alarm signal from the alarm output circuit.

On the other hand, the outputs of the AND circuits 71, 73, and 75 are also input into the OR circuit 81, and the output of the OR circuit 81 is connected to the overheat detection terminal 51d. Thereby, it is determined that at least one of the diodes 91 to 96 is in an overheated state, when the IGBTs 1 and 2, the IGBTs 3 and 4, or the IGBTs 5 and 6 of the upper arm unit and the lower arm unit in each arm unit are overheated to the medium temperature or more simultaneously. In this case, it is not preferable that the diodes 91 to 96 continue operating at the high temperature, and therefore, in the control IC 11, the alarm output circuit receives a protection operation signal of high level from the overheat detection terminal 51d and outputs an alarm signal.

As described above, the semiconductor module according to the ninth embodiment has the case overheat detection function, and additionally can detect the overheat of the diodes 91 to 96, which generate heat in the same way as the IGBTs 1 to 6 but do not have the temperature detection function.

Note that, in the above embodiment, the IPM including six switching elements has been described as an example. However, the present disclosure is not limited to such an IPM, but can be applied to a semiconductor module that includes an arbitrary number of switching elements.

The above just illustrates the principle of the present disclosure. Further, a person skilled in the art will make various modifications and alterations, and the embodiments are not exactly limited to the exemplary configurations and applications illustrated and described above, but encompasses all corresponding exemplary variants and equivalents thereof in the scope of the appended claims and equivalents thereof.

The semiconductor module of the above configuration can detect case overheat without a dedicated temperature detection IC, and thus advantageously reduces the number of components. Also, the semiconductor module detects temperature of chips, which are heat generation sources, as operation temperature of case overheat protection, and thereby improves detection accuracy.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor module comprising:
a plurality of switching elements provided with respective temperature detection elements for chip temperature detection, a plurality of diodes for protecting the switching elements, and a plurality of control circuits for controlling the switching elements, in one package, wherein the control circuits include respective comparators that compare temperatures detected by the temperature detection elements with a predetermined reference temperature for a case,
at least a first control circuit and a second control circuit among the control circuits includes a logical AND circuit,
the logical AND circuits of the first and second control circuit are connected to outputs of the respective comparators to receive as inputs to the logical AND circuits only the outputs of the respective comparators, and
the logical AND circuit of the second control circuit receives outputs of at least two of the comparators, including the first comparator, and determines case overheat based on the outputs of the at least two comparators.

2. The semiconductor module according to claim 1, wherein the switching elements are located in upper arm units and lower arm units of first to third arm units of a multi-phase power device in order to form an inverter circuit.

3. The semiconductor module according to claim 2, wherein
the logical AND circuit receives outputs of lower-arm comparators of three control circuits for controlling the switching elements located in the lower arm units, among the comparators.

4. The semiconductor module according to claim 3, wherein
the logical AND circuit additionally receives at least one of outputs of upper-arm comparators of the control circuits for controlling the switching elements located in the upper arm units, among the comparators.

5. The semiconductor module according to claim 2, wherein
the logical AND circuit receives outputs of upper-arm comparators of three control circuits for controlling the switching elements located in the upper arm units, among the comparators.

6. The semiconductor module according to claim 5, wherein
the logical AND circuit additionally receives at least one of outputs of lower-arm comparators of the control circuits for controlling the switching elements located in the lower arm units, among the comparators.

7. The semiconductor module according to claim 2, wherein
the logical AND circuit receives outputs of upper-arm comparators of two control circuits for controlling the switching elements located in any two of the upper arm units, and outputs of lower-arm comparators of two control circuits for controlling the switching elements located in any two of the lower arm units, among the comparators.

8. The semiconductor module according to claim 2, wherein
the logical AND circuit includes
a first logical AND circuit that receives outputs of first-arm comparators of two control circuits for controlling the switching elements located in an upper arm unit and a lower arm unit of a first arm unit, among the comparators,
a second logical AND circuit that receives outputs of second-arm comparators of two control circuits for controlling the switching elements located in an upper arm unit and a lower arm unit of a second arm unit, among the comparators, a third logical AND circuit that receives outputs of third-arm comparators of two control circuits for controlling the switching elements located in an upper arm unit and a lower arm unit of a third arm unit, among the comparators, and a fourth logical AND circuit that receives outputs of the first logical AND circuit, the second logical AND circuit, and the third logical AND circuit.

9. The semiconductor module according to claim 8, further comprising a logical OR circuit that receives the outputs of the first logical AND circuit, the second logical AND circuit, and the third logical AND circuit.

10. A semiconductor module comprising:

a first switching element;

a first temperature detection element to detect a temperature of a chip including the first switching element;

a first control circuit for controlling a switching operation of the first switching element, the first control circuit including a first comparator to compare a voltage corresponding to a temperature of the first temperature detection element with a threshold voltage;

a second switching element;

a second temperature detection element to detect a temperature of a chip including the second switching element;

a second control circuit for controlling a switching operation of the second switching element, the second control circuit including a second comparator to compare a voltage corresponding to a temperature of the second temperature detection element with the threshold voltage, wherein the semiconductor module includes a plurality of control circuits, including the first and second control circuits, and a plurality of comparators, including the first and second comparators, wherein the first control circuit includes a first logic circuit, wherein the second control circuit includes a second logic circuit, wherein the first and second logic circuits are connected to the plurality of comparators to receive as inputs only outputs of the plurality of comparators, wherein the second logic circuit is connected to the first and second comparators to receive outputs of the first and second comparators as inputs to the second logic circuit, and wherein the second logic circuit generates at an overheat signal based on outputs of each of the first comparator and the second comparator.

11. The semiconductor module of claim 10, further comprising third and fourth switching elements, third and fourth temperature detection elements to detect temperatures of the chip including the third and fourth switching element, and third and fourth control circuits, among the plurality of control circuits, for controlling switching operations of the third and fourth switching elements, wherein the third and fourth control circuits include third and fourth comparators, among the plurality of comparators, to compare voltages corresponding to temperatures of the third and fourth temperature detection elements with the threshold voltage, wherein the first and third switching elements are located in upper arms of a multi-phase power device, wherein the second and fourth switching elements are located in lower arms of a multi-phase power device.

12. The semiconductor module of claim 11, wherein the third control circuit includes a third logic circuit, wherein an output of the fourth comparator is connected to an input of the third logic circuit, and wherein an output of the third logic circuit is connected to an input of the second logic circuit.

13. The semiconductor module of claim 12, wherein the first logic circuit is an AND circuit configured to perform a logical AND operation on the output of the first comparator, the second comparator, and the third logic circuit.

14. The semiconductor module of claim 10 further comprising third and fourth switching elements, third and fourth temperature detection elements to detect temperatures of the chip including the third and fourth switching element, and third and fourth control circuits, among the plurality of control circuits, for controlling switching operations of the third and fourth switching elements, wherein the third and fourth control circuits include third and fourth comparators, among the plurality of comparators, to compare voltages corresponding to temperatures of the third and fourth temperature detection elements with the threshold voltage, wherein the first and second switching elements are located in upper arms of a multi-phase power device, wherein the third and fourth switching elements are located in lower arms of the multi-phase power device, wherein an output of the fourth comparator is connected to an input of the second logic circuit, and wherein each of the second logic circuit and the third logic circuit output separate overheat signals corresponding to the upper arm and the lower arm, respectively.

15. The semiconductor module of claim 11, wherein the second logic circuit includes a first AND gate for performing a logical AND operation on at least two outputs from the first, second, third, and fourth comparators, wherein the logic circuit includes an OR gate connected to an output of the first AND gate and at least two outputs from the first, second, third, and fourth comparators for performing a logical OR operation on at least two outputs from the first AND gate and the first, second, third, and fourth comparators, and a second AND gate connected to an output of the first AND gate and the at least two outputs from the first, second, third, and fourth comparators for performing a logical AND operation on the at least two outputs from the first AND gate and the first, second, third, and fourth comparators.

* * * * *